United States Patent [19]
Tuttle et al.

[11] Patent Number: 5,232,875
[45] Date of Patent: Aug. 3, 1993

[54] METHOD AND APPARATUS FOR IMPROVING PLANARITY OF CHEMICAL-MECHANICAL PLANARIZATION OPERATIONS

[75] Inventors: Mark E. Tuttle; Trung T. Doan; Angus C. Fox; Gurtej S. Sandhu; Hugh E. Stroupe, all of Boise, Id.

[73] Assignee: Micron Technology, Inc., Boise, Id.

[21] Appl. No.: 961,565

[22] Filed: Oct. 15, 1992

[51] Int. Cl.⁵ .................. H01L 21/302; H01L 21/463
[52] U.S. Cl. .................... 437/225; 437/946; 437/228; 156/636; 156/637; 156/903; 51/131.1; 51/131.2; 51/131.3; 51/33 R; 51/90; 51/119; 51/133
[58] Field of Search ............ 437/225, 8, 946, 228; 156/636, 643, 627; 51/317, 131.1, 131.2, 131.3, 131.4, 131.5, 90, 33 R, 237 M, 237 R, 241 T, 132–133, 119

[56] References Cited
U.S. PATENT DOCUMENTS

| | | | |
|---|---|---|---|
| 3,979,239 | 9/1976 | Walsh | 156/4 |
| 4,910,155 | 3/1990 | Cote et al. | 437/225 |
| 4,940,507 | 7/1990 | Harbarger | 156/636 |
| 5,081,421 | 1/1992 | Miller et al. | 324/671 |

Primary Examiner—Olik Chaudhuri
Assistant Examiner—H. Jey Tsai
Attorney, Agent, or Firm—Fox, III: Angus C.

[57] ABSTRACT

A method and apparatus for improving planarity of chemical mechanical planarization of semiconductor wafers. The wafer is affixed to the planar surface of a wafer carrier. A planar platen, on which is mounted a polishing pad, is moved about in a plane parallel to the pad surface with either an orbital, fixed-direction vibratory, or random-direction vibratory motion. In one embodiment of the invention, pressure between the surface of the wafer to be polished and the moving polishing pad is generated by the force of gravity acting on at least the wafer and the carrier; in another it is provided by a mechanical force applied normal to the wafer surface. The polishing pad is wetted with a slurry having abrasive particles suspended in a liquid which may be chemically reactive with respect to at least one material on the wafer.

25 Claims, 6 Drawing Sheets

METHOD AND APPARATUS FOR IMPROVING PLANARITY OF CHEMICAL-MECHANICAL PLANARIZATION OPERATIONS

FIELD OF THE INVENTION

This invention relates to integrated circuit manufacturing technology and, more specifically, to processes for grinding or polishing surfaces of wafer-type substrates, such as those of semiconductor wafers, in order to achieve a controlled degree of planarity.

BACKGROUND OF THE INVENTION

In the manufacture of integrated circuits, wafer surface planarity is of extreme importance. Photolithographic processes are typically pushed close to the limit of resolution in order to create maximum circuit density. For 16-megabit dynamic random access memories, minimum critical dimensions, such as wordline and bitline width, will initially be in the $0.5\mu$–$0.7\mu$ range. Since these geometries are photolithographically produced, it is essential that the wafer surface be highly planar so that the electromagnetic radiation used to create a mask may be accurately focused at a single level, thus resulting in precise imaging over the entire surface of the wafer. Were the wafer surface not sufficiently planar, the resulting structures would be poorly defined, with the circuit being either nonfunctional or, at best, endowed with less than optimum performance.

In order to achieve the degree of planarity required to produce ultra high density integrated circuits, chemical-Micron mechanical planarization processes are being employed with increasing frequency. In general, chemical-mechanical planarization (CMP) processes involve pressing a semiconductor wafer against a moving polishing surface that is wetted with a chemically reactive, abrasive slurry. Slurries are usually either basic or acidic and generally contain alumina or silica particles. The polishing surface is typically a planar pad made of a relatively soft, porous material such as blown polyurethane. The pad is usually mounted on a planar platen.

FIG. 1 depicts a conventional rotational CMP apparatus. The apparatus comprises a wafer carrier 11 for holding a semiconductor wafer 12. A soft, resilient pad 13 is typically placed between the wafer carrier 11 and the wafer 12, and the wafer is generally held against the resilient pad by a partial vacuum. The wafer carrier 11 is designed to be continuously rotated by a drive motor 14. In addition, the wafer carrier 11 is also designed for transverse movement as indicated by the double headed arrow 15. The rotational and transverse movement is intended to reduce variability in material removal rates over the surface of the wafer 12. The apparatus further comprises a rotating platen 16, on which is mounted a polishing pad 17. The platen 16 is relatively large in comparison to the wafer 12, so that during the CMP process, the wafer 12 may be moved across the surface of the polishing pad 17 by the wafer carrier 11. A polishing slurry containing chemically-reactive solution, in which are suspended abrasive particles, is deposited through a supply tube 18 onto the surface of the polishing pad 17.

FIG. 2 illustrates the basic principles of the conventional rotational CMP process. The polishing pad 17 is rotated at an angular velocity of $W_P$ radians per second (rads./sec.) about axis 0. The wafer to be planarized 12 is rotated at an angular velocity of $W_w$ rads/sec., typically in the same rotational sense as the pad. It is easily understood that the linear speed (L) of the polishing pad, in centimeters/sec., at any given radius (r), in centimeters from axis 0, will be equal to $W_p r$. Experience has demonstrated that the rate of removal of material from the wafer surface is related to the speed with which the pad surface makes contact with the wafer surface.

There are a number of disadvantages related to the conventional CMP process:

(1) From the foregoing discussion, it should be evident that achieving wafer planarity using conventional rotational CMP is no trivial task. The wafer must be carefully and continuously monitored during the material removal process.

(2) Conventional CMP equipment is complex, massive, and must be built to low-tolerance specifications. The conventional CMP method calls for two rotating surfaces to be brought into accurate planar contact with one another. Moreover, one of those rotating surfaces must be transversely moveable. Some of the massiveness is attributable to the fact that, as the diameter of the platen increases with respect to the diameter of the wafer being planarized, uniformity of removal rate can be maximized by utilizing the of the platen near the edge. In addition, if water cooling of the wafer carrier is implemented, the flow of water into the carrier requires the use of rotating seals. Such precision complexity ensures relatively high equipment costs.

(3) Maintaining temperature within a narrow range at the wafer surface is difficult because of the time lag inherent in the transfer of heat between the cooling water, the massive platen, the wafer carrier, and the wafer.

(4) Dishing occurs when material regions of two different hardnesses are present on the wafer surface. For example, aluminum lines imbedded in a silicon dioxide layer become recessed (dished) when subjected to conventional CMP. This problem is generally attributed to the high wafer-to-pad pressures involved, which cause distortion of the polishing pad. Pressures exerted on the wafer by the polishing pad are typically within a range of $0.3 \times 10^5$ to $1.3 \times 10^5$ pascals (approx 4 to 20 pounds per square inch).

(5) Conventional CMP equipment requires a continuous feed of slurry, which can be either discarded after being flung off the spinning pad and wafer, or captured and recirculated. In order to maintain the abrasive particles suspended in the liquid, slurry must be continually agitated.

(6) The polishing pads used in conventional CMP processes must be periodically reconditioned, due to the packing of abrasive particles into the pores thereof (a phenomenon referred to as "glazing").

SUMMARY OF THE INVENTION

The present invention is an improved apparatus and method for performing chemical mechanical planarization on wafer-like substrates. In this disclosure, it should be kept in mind that the term "wafer" may apply to many types of wafer-like substrates. Semiconductor wafers represent but one example of such substrates. The disadvantages associated with the conventional rotational CMP process are either eliminated altogether or very much mitigated. The apparatus comprises a platen having a planar surface, on which is mounted a polishing pad having a porous surface. The platen is moved about in a plane parallel to the pad surface with either an orbital, fixed-direction vibratory (i.e., back and forth), or random-direction vibratory motion. Although the wafer may be affixed to the carrier by one of several known methods (including vacuum, friction, adhesive, etc.), friction is deemed to be the preferred method. Frictional affixation may be accomplished by placing a resilient backing pad of uniform thickness between the carrier and the wafer, the backing pad having a higher coefficient of friction with respect to the wafer and carrier surface with which it is contact on opposite sides than the coefficient of friction of the wafer with respect to the slurry saturated polishing pad.

In one embodiment of the invention, pressure between the surface of the wafer to be polished and the moving polishing pad is generated only by the force of gravity acting on at least the wafer and the carrier; in another it is provided by a mechanical force applied normal to the wafer surface. The polishing pad is wetted with a slurry having abrasive particles suspended in a liquid which may be chemically reactive with respect to at least one material on the wafer.

In still another embodiment of the invention, the platen is equipped with a barrier wall, which surrounds the pad. Slurry is maintained on the platen by the barrier wall.

In yet another embodiment, fresh slurry is discharged from a supply tube onto the upper surface of the polishing pad.

In a further embodiment of the invention, slurry is fed from a supply tank to a network of channels below a slurrypermeable polish pad. Fresh slurry continuously emanates from the pad.

DETAILED DESCRIPTION OF THE INVENTION

Figure 1:
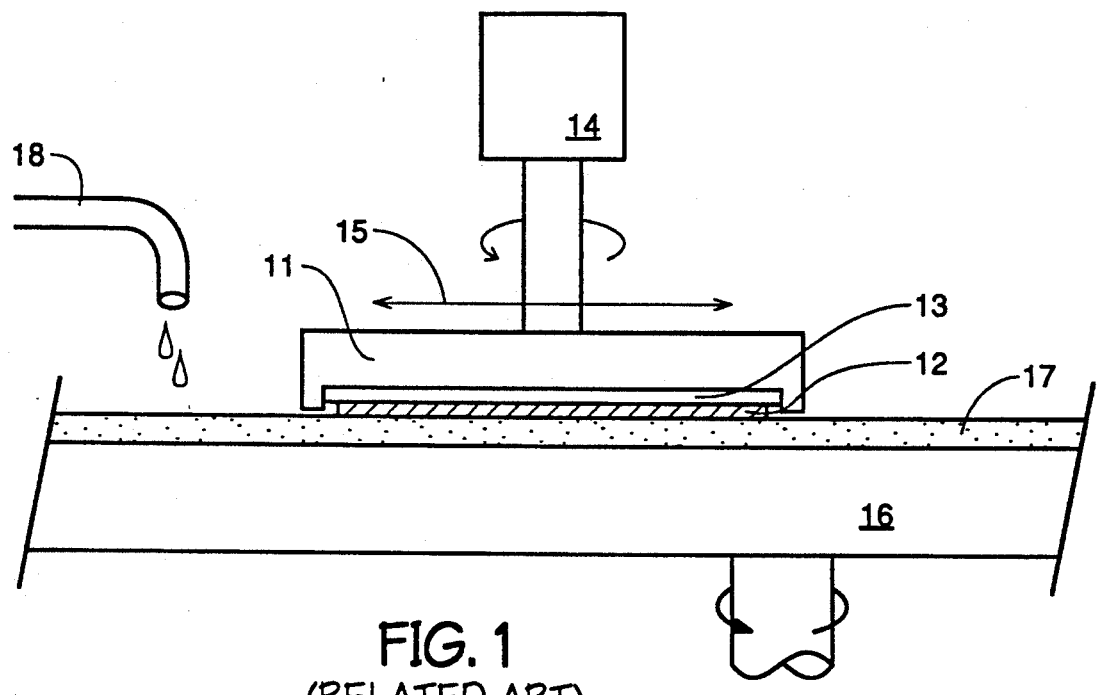
FIG. 1 is an elevational side view of a prior art rotational CMP apparatus.
Figure 2:
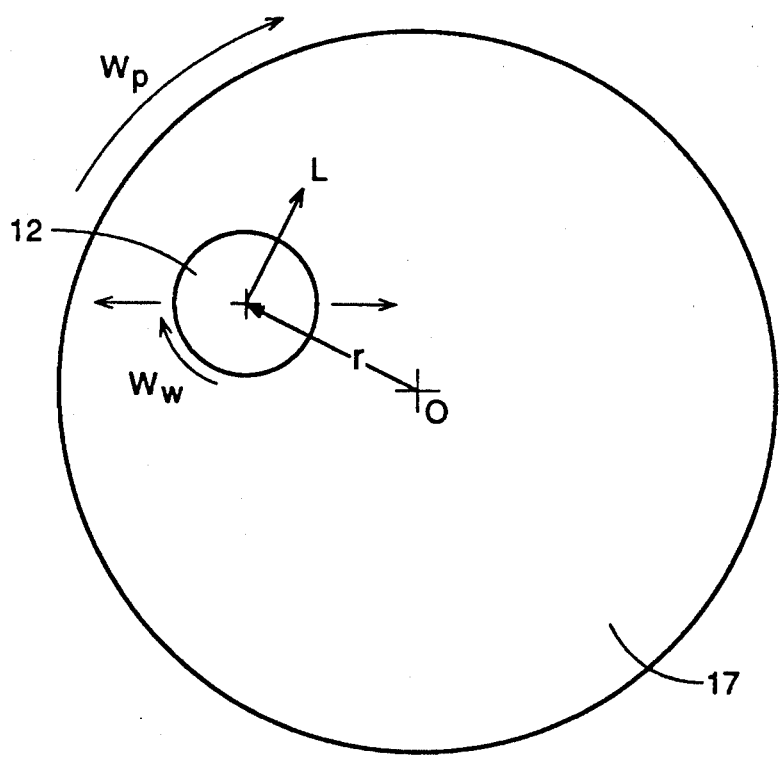
FIG. 2 is a top plan view of a prior art rotational CMP apparatus.
Figure 3:
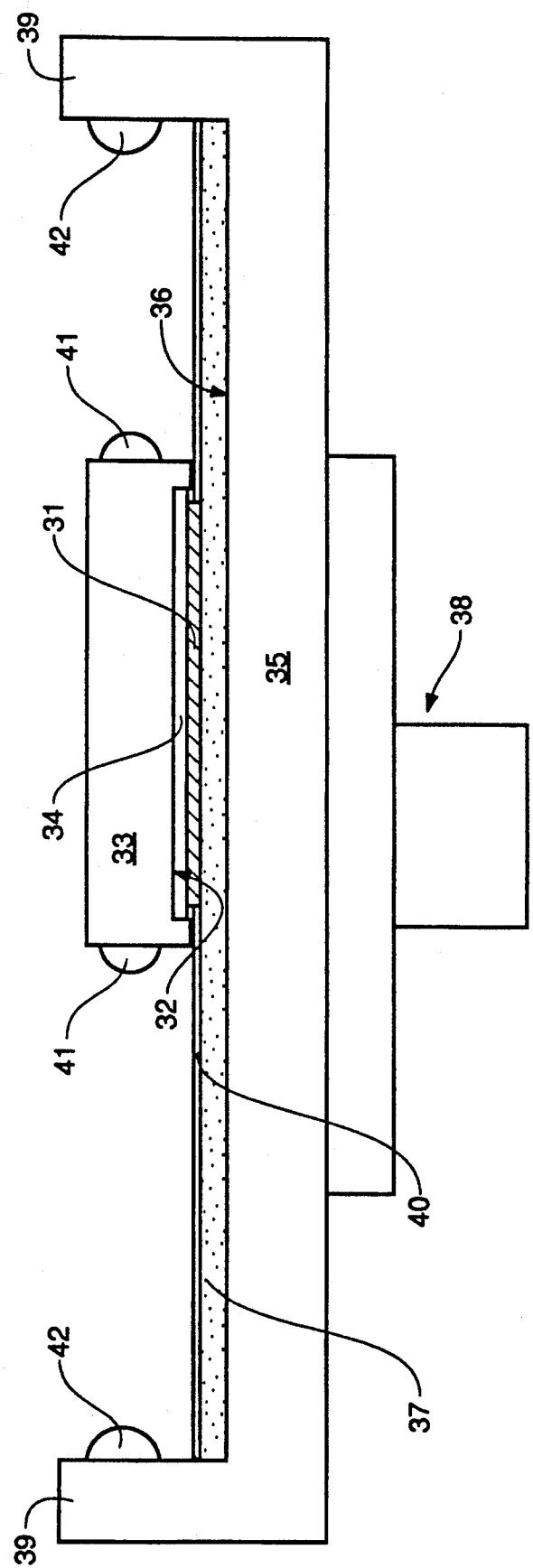
FIG. 3 is a side elevational view of one embodiment of the new CMP apparatus, which has a free-floating wafer carrier.

Referring now to one embodiment of the new chemical mechanical planarization apparatus depicted in FIG. 3, a semiconductor wafer 31 is affixed to a lower planar surface 32 of a weighted, free-floating wafer carrier 33. Although affixation of the wafer 31 to the carrier surface 32 may be accomplished using any one of a number of well-known techniques (e.g. mechanical affixation, vacuum affixation, frictional affixation, etc.), frictional affixation is deemed to be the preferred technique. Although frictional affixation may be accomplished with a uniformly-thick, non-slip coating (e.g., photograph album adhesive or a similar such compound), in a preferred embodiment of the invention, a uniformly-thick, resilient backing pad 34 is inserted between the wafer 31 and the planar surface 32 of the carrier 33.

Still referring to FIG. 3, a platen 35 having a planar upper surface 36, and to which is secured a porous polishing pad 37 of uniform thickness, is coupled to a mechanical drive assembly 38 which moves the platen 35 in a plane parallel to its upper planar surface 36 in either an orbital, fixed-direction vibratory, random-direction vibratory motion. In the case of vibratory motion, the random-direction variety is the preferred mode, whereas in the case of orbital motion, it is desirable that the motion be circular. In the case of circular orbital motion, each point on the wafer or substrate experiences abrasive action from all directions. Over time, that will also be true of random-direction vibratory motion. As drive assemblies providing fixed-direction vibratory motion, random-direction vibratory motion and circular orbital motion are well known in the art, it is not deemed necessary to describe the mechanical aspects of such devices. The platen is equipped with a barrier wall 39 which surrounds the polishing pad 37. Slurry 40 is maintained on the platen by the barrier wall 39. In addition, the barrier wall 39 prevents the wafer and carrier 32 from wandering off the pad. A resilient bumper 41, which surrounds the carrier 32, cushions impacts between the carrier 33 and the barrier wall 39. As an alternative or supplement to the resilient bumper 41, the barrier wall 39 may be fitted with a resilient cushion 42. In order to ensure adequate frictional affixation of the wafer 31 to the wafer carrier surface 32, the coefficients of friction between the backing pad 34 and the wafer 31, on one side, and the carrier surface 32, on the other, are significantly greater (e.g. at least 1.5 times) that of the coefficient of friction between the wafer and the slurry-wetted polishing pad 37.

Figure 4:
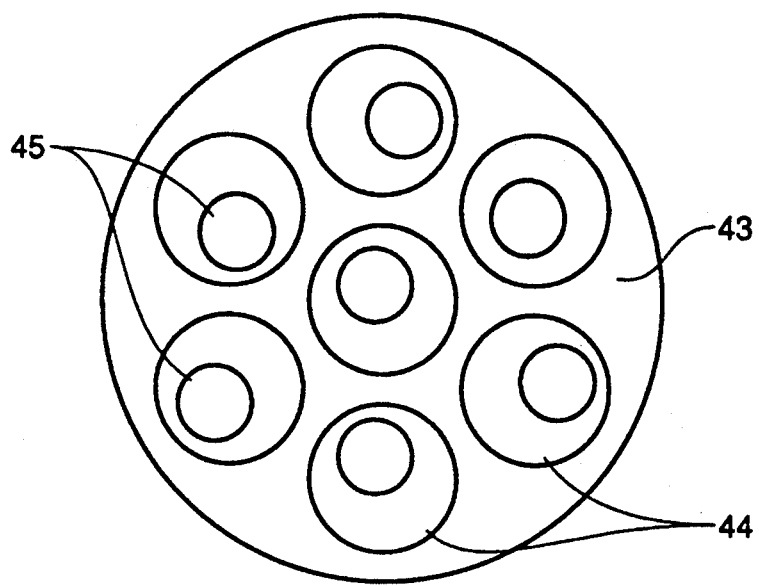
FIG. 4 is a top plan view of the new CMP apparatus configured for processing multiple wafers simultaneously.

The new process, particularly in combination with the free-flooding carrier embodiment of FIG. 3, lends itself to improved wafer throughput. At 60 Hz and with a random vibratory stroke of approximately 1 cm, a removal rate of 500Å of silicon dioxide per minute has been observed. Removal rate depends on the frequency of vibration or orbital movement; an increase in frequency will result in an increase in the material removal rate. The process can be adapted to process multiple wafers simultaneously on a single vibrating or orbitally moving body. FIG. 4 depicts such an embodiment. Although 7 wafers may be planarized simultaneously on a single moving body 43, it will be noted that only the individual platens 44 on which each wafer carrier assembly 45 (a wafer 31 in combination with its associated carrier 33 and backing pad 34) rests (with the polishing pad 37 in between) need be precision machined for planarity. Machine cost would increase substantially were it necessary to precision planarize a single large platen shared by all wafers.

Figure 5:
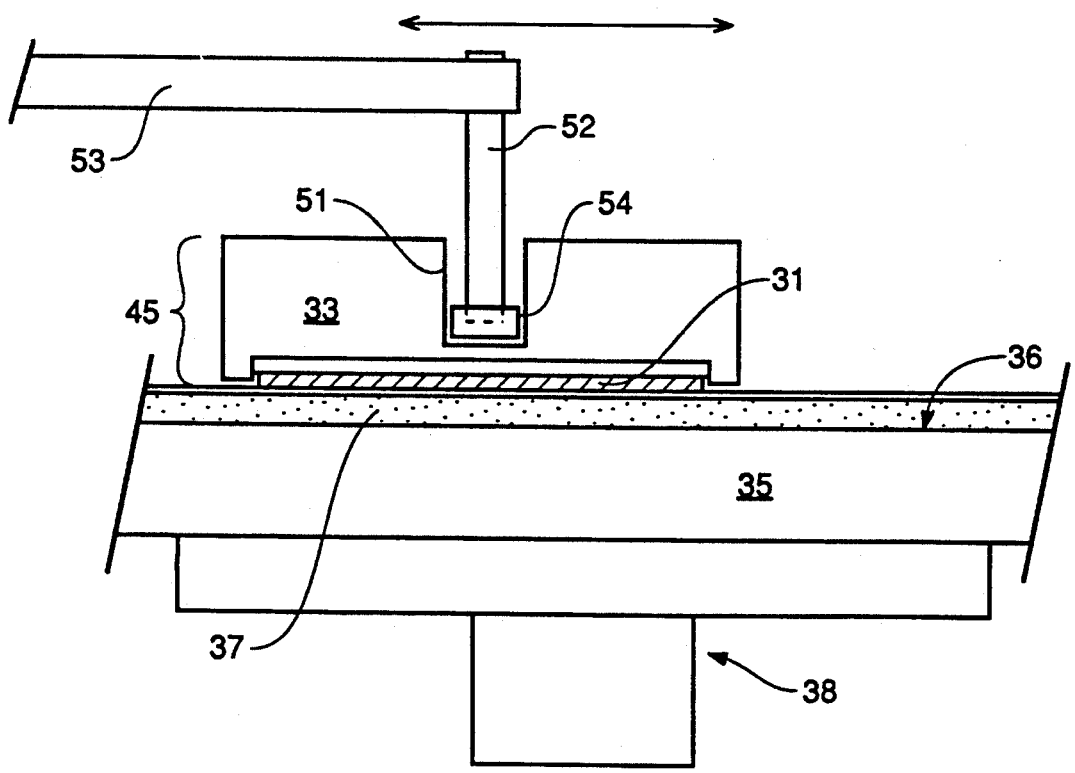
FIG. 5 is a side elevational view of an alternative embodiment of the new CMP apparatus having a movement limiting control arm.

In another embodiment of the invention depicted in FIG. 5, the wafer carrier 33 is provided with a central recess 51. A vertical pin 52 affixed to a control arm 53 is positioned within recess 51 such that it does not contact the bottom of recess 51. An optional resilient sleeve 54 is pressed onto vertical pin 52. There is sufficient clearance between the pin 52 and the recess 51 or, alternatively, between the resilient sleeve 54 and the recess 51 such that there is insignificant interference with the gravitational force which presses the wafer 31 against pad 37.

Figure 6:
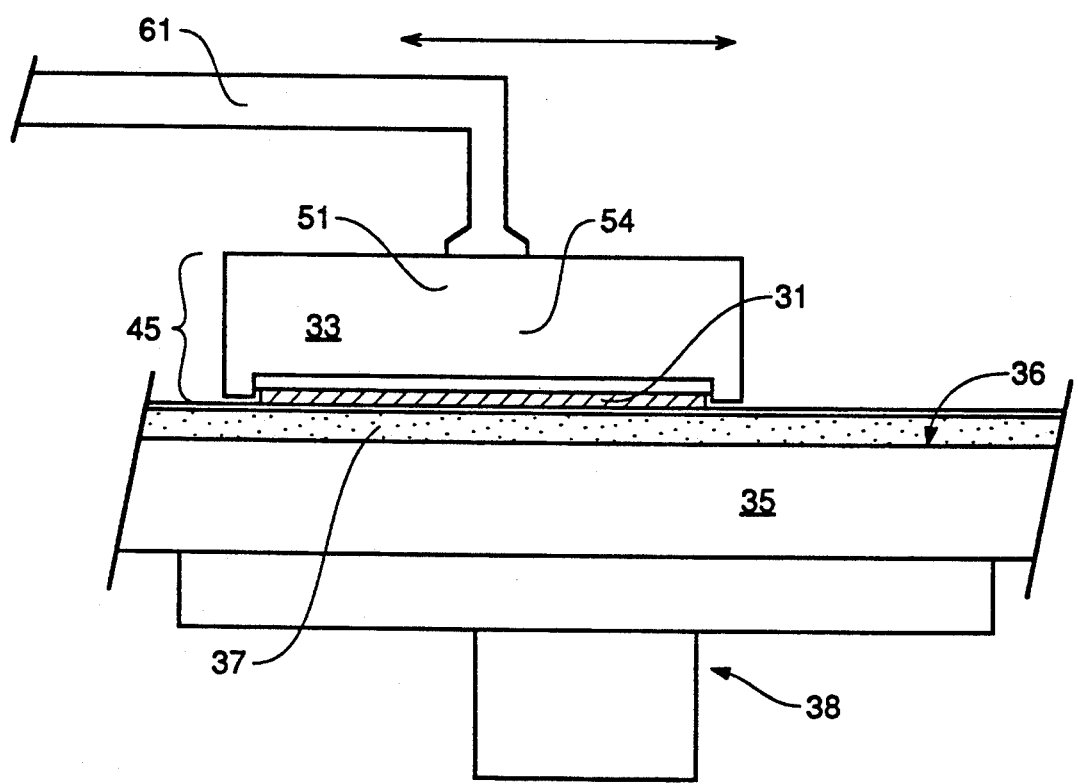
FIG. 6 is a side elevational view of still another alternative embodiment, in which downward mechanical pressure is applied to the wafer carrier.

Referring now to FIG. 6, a further embodiment of the invention is depicted for which the pressure between the wafer 31 and the polishing pad 37 is independent of the mass of the wafer carrier assembly 45. This embodiment has a rigid carrier mounting arm through which a downward force may be applied to the carrier assembly 45 through control arm 61. Control arm 61 may also provide rotation of the carrier assembly 45 if so desired.

Figure 7:
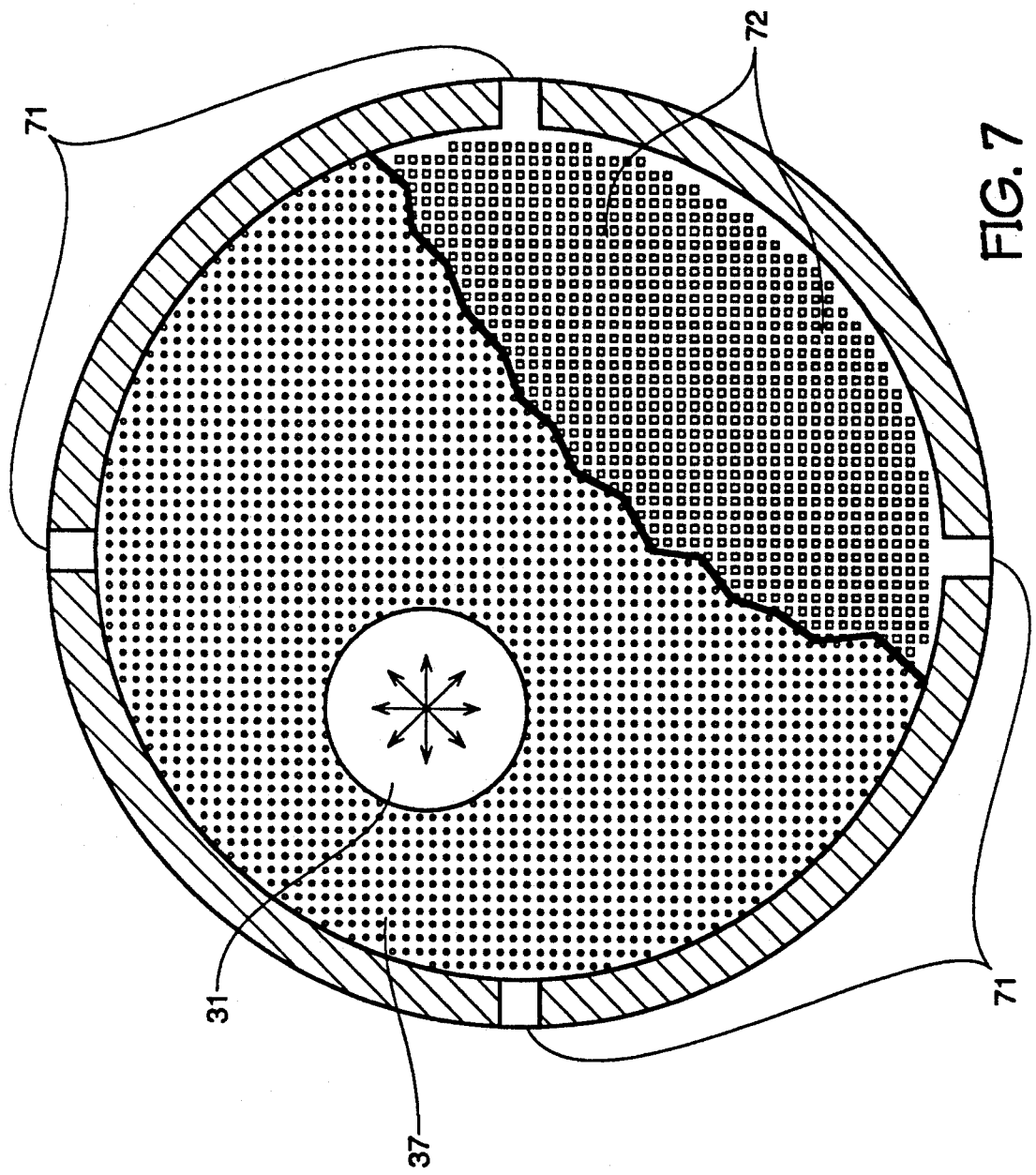
FIG. 7 is a top elevational view of the platen of a preferred embodiment of the new CMP apparatus, showing a network of slurry feed channels.

In the embodiment depicted in FIG. 7, slurry is fed from a supply 71 to a network of channels 72 beneath the pad 37.

Figure 8:
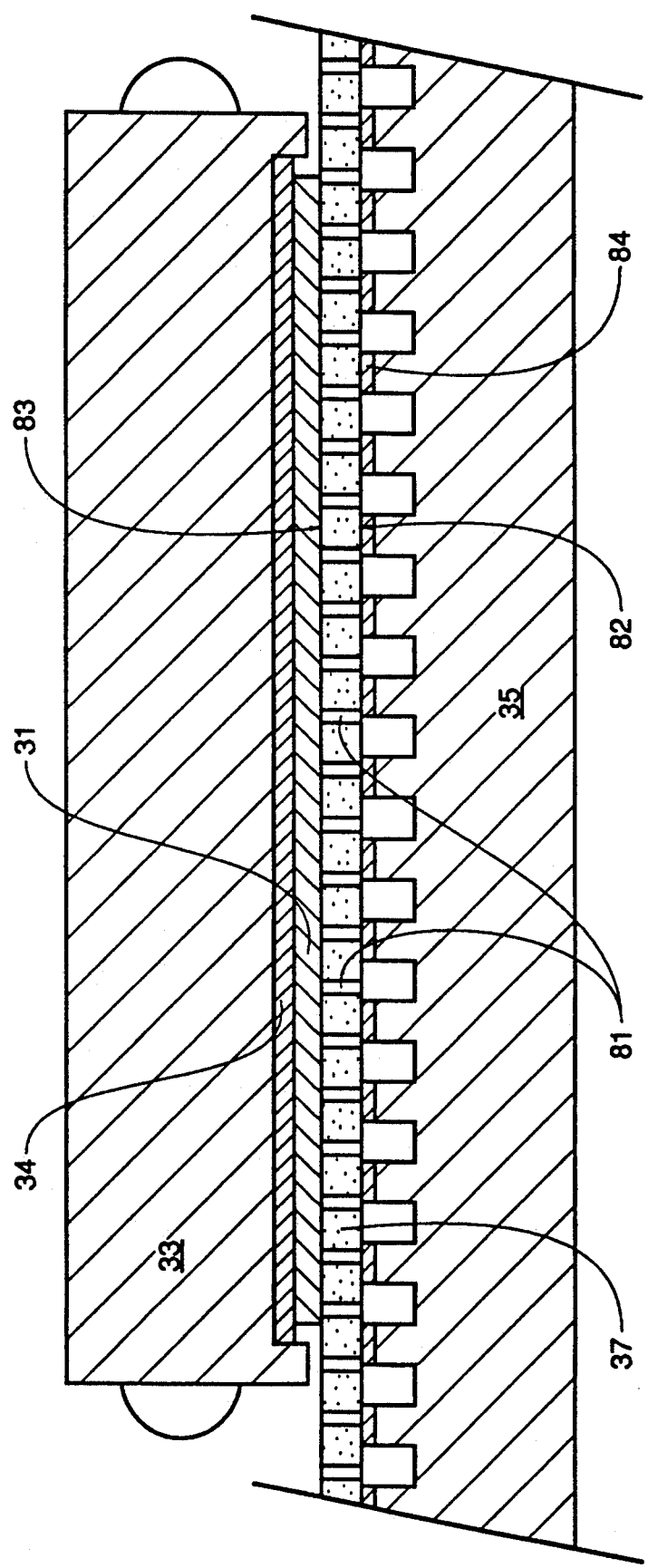
FIG. 8 is a cross-sectional side view of an embodiment of the new CMP apparatus which incorporates the network of slurry feed channels.

Referring now to FIG. 8, open pores 81 which extend from the lower surface 82 of the pad 37 to the upper surface 83 thereof supply slurry to the wafer-pad interface. Also visible in this cross-sectional view is an adhesive layer 84, which secures the pad 37 to the upper surface of the platen 35.

All embodiments of the invention share the following common characteristic: Every point on the surface of the platen and, hence, the polishing pad surface, experiences identical relative motion due to the absence of a net rotational component of movement. For certain embodiments, a wafer is held against the polishing pad 37 exclusively by the effect of gravity on the wafer 31 and those items stacked on the top thereof (i.e., the carrier 33, and the backing pad 34, etc.), while for other embodiments, the pressure between the wafer 31 and the polish pad 37 may be variably and mechanically applied. In certain embodiments, the wafer 31 is free floating. That is, it freely floats on a thin layer of slurry 40 as the platen 35 moves below it. In other embodiments, horizontal movement of the wafer 31, carrier 33, and backing pad 34 is constrained by the vertical pin 52, although the wafer 31 floats on a thin layer of slurry 40.

The new CMP apparatus and method have a number of advantages over the apparatus and methods of the prior art. Machine complexity and, thus, machine cost, are greatly reduced. In addition, the new machine design requires no rotating seals for the wafer heating system. Maintenance of a wafer temperature within a narrow range may be easily accomplished by heating the platen, heating the slurry, or a combination of both techniques.

In addition, the problem of dishing is greatly ameliorated, since the new CMP process works well with pad-to-wafer pressures of as little as 0.065 pascals (approximately 1.00 p.s.i.). The reduction in pressure, coupled with the continuous agitation of the slurry by the vibrating platen, also ameliorates the glazing phenomenon that is common to the rotational CMP process. The constant vibration of the platen also maintains the slurry particles in suspension. Because slurry is not continually flung from rotating disks (i.e., the pad and wafer), there is no need to constantly replenish the slurry.

Uniformity of material removal from the wafer is also substantially improved. Surface variation following the new process has been shown experimentally to be greatly reduced. Approximately a two-thirds reduction has been commonly observed.

Although only several embodiments of the invention have been disclosed and described herein, it will be obvious to those having ordinary skill in the art of chemical mechanical planarization that changes and modifications may be made thereto without departing from the scope and the spirit of the appended claims.

For example, it is obvious that the wafer may be moved with a fixed-direction vibratory, random-direction vibratory, or orbital motion against a stationary platen. In addition, it is also obvious that wafer-like substrates other than semiconductor wafers may be processed using the described apparatus. Other wafer-like workpieces, including (but not limited to) flat panel display components, disk drive platters, and compact discs, may be planarized using the described process.

What is claimed is:

1. A chemical mechanical planarization apparatus comprising
   a platen having a horizontal, planar upper surface;
   a slurry-wetted, uniformly-thick polishing pad affixed to said upper surface;
   a wafer carrier having a lower planar surface to which one side of a semiconductor wafer is removably attachable, the other side of said wafer being disposed against said slurry-wetted polishing pad; and
   means for imparting non-rotational motion to said platen upper surface, said motion being parallel to that upper surface, and also providing every point on that upper surface with identical during same time interval.

2. The apparatus of claim 1, wherein said motion imparted to said upper surface is random-directed vibratory motion.

3. The apparatus of claim 1, wherein said motion imparted to said upper surface is fixed-direction vibratory motion.

4. The apparatus of claim 1, wherein said motion imparted to said upper surface is ellipsoid orbital motion.

5. The apparatus of claim 4, wherein the distance between the loci of the ellipse, which defines said ellipsoid orbital motion, is zero.

6. The apparatus of claim 1, wherein said wafer is pressed against the polishing pad by the effect of gravity on at least the wafer, itself, and the wafer carrier.

7. The apparatus of claim 1, wherein the wafer is pressed against the polishing pad by mechanical force.

8. The apparatus of claim 1, which further comprises a uniformly-thick, resilient backing pad which is placed between the wafer and said lower planar surface, said resilient backing pad providing frictional attachment of the wafer to the wafer carrier.

9. The apparatus of claim 7, wherein the coefficients of friction between the backing pad and the wafer, on one side, and the carrier surface, on the other, are at least 1.5 times that of the coefficient of friction between the wafer and the slurry-wetted polishing pad.

10. The apparatus of claim 1, wherein said polishing pad has a porous surface.

11. The apparatus of claim 1, wherein said polishing pad is equipped with perforations which extend from a lower surface thereof to an upper surface thereof.

12. The apparatus of claim 11, wherein slurry is supplied from a supply to the via a network of channels in the upper surface of the platen.

13. The apparatus of claim 1, wherein the platen is equipped with a barrier wall which surrounds the polishing pad and retains slurry thereon.

14. The apparatus of claim 13, wherein said barrier wall prevents the wafer carrier and an attached wafer from wandering beyond the limits of the platen.

15. The apparatus of claim 14, wherein said wafer carrier is equipped with a resilient bumper, which surrounds the carrier and cushions impacts between the carrier and the barrier wall.

16. The apparatus of claim 14, wherein said barrier wall is equipped with a resilient cushion, which cushions impacts between the carrier and the barrier wall.

17. A method for performing a chemical-mechanical planarization operation on a wafer having front-side and back-side planar surfaces, said method comprising the step of disposing the front-side surface against an abrasive planar surface, said abrasive planar surface being moved non-rotationally, and in a man every point on said front-side surface experiences both virtually identical pressure against said abrasive planar and identical relative motion, with respect to said abrasive planar surface, during the same time interval.

18. The method of claim 17, wherein said motion is random-direction vibratory motion.

19. The method of claim 17, wherein said motion is fixed-direction vibratory motion.

20. The method of claim 17, wherein said motion is ellipsoid orbital motion.

21. The method of claim 20, wherein the distance between the loci of the ellipse, which defines the ellipsoid orbital motion, is zero.

22. The method of claim 17, wherein said abrasive planar surface comprises a polishing pad wetted with a slurry having abrasive particles suspended in a liquid.

23. The method of claim 22, wherein said liquid is chemically-reactive with respect to at least one material on the front-side of said wafer.

24. The method of claim 22, wherein said abrasive planar surface is horizontal, said wafer is attached to a wafer carrier, and the pressure between said front-side surface and said abrasive planar surface is generated by the force of gravity acting on at least said wafer and said carrier.

25. The method of claim 22, wherein said abrasive planar surface is horizontal, said wafer is attached to a wafer carrier, and the pressure between said front-side surface and said abrasive planar surface is variably and mechanically applied.

* * * * *